(12) United States Patent
Chai et al.

(10) Patent No.: US 6,452,822 B1
(45) Date of Patent: Sep. 17, 2002

(54) SEGMENTED MATCH LINE ARRANGEMENT FOR CONTENT ADDRESSABLE MEMORY

(75) Inventors: Chiaming Chai, Durham; Jeffrey Herbert Fischer, Cary; Michael ThaiThanh Phan, Apex, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/842,958

(22) Filed: Apr. 26, 2001

(51) Int. Cl.[7] .............................................. G11C 15/00
(52) U.S. Cl. ..................... 365/49; 365/189.07
(58) Field of Search .......................... 365/49, 189.07, 365/195; 711/108

(56) References Cited

U.S. PATENT DOCUMENTS

| | | | |
|---|---|---|---|
| 5,446,685 A | * 8/1995 | Holst | 365/49 |
| 5,471,189 A | 11/1995 | Dietz et al. | 340/146.2 |
| 5,517,441 A | 5/1996 | Dietz et al. | 365/49 |
| 5,642,114 A | 6/1997 | Komoto et al. | 341/67 |
| 5,659,697 A | 8/1997 | Dietz | 395/417 |
| 5,859,791 A | 1/1999 | Schultz et al. | 365/49 |

* cited by examiner

Primary Examiner—Tan T. Nguyen
(74) Attorney, Agent, or Firm—James A. Lucas; Driggs, Lucas, Brubbaker & Hogg

(57) ABSTRACT

A semiconductor content addressable memory (CAM) is described that has the enhanced capability of simultaneously performing content search operations between two sets of input data and stored data. This invention utilizes a segmented ML scheme, where one long ML is separated into two parts: a SML (Segmented ML) and a main ML. The SML is for evaluation of the comparison between input A and the content stored in an array of CAM cells A, and the main ML is for evaluation of the comparison between input B and the content stored in an array of CAM cells B. A specialized circuit that ties the SML and the main ML together is provided. The SML sense & restore is utilized to sense the value on the SML, send the result to the main ML if the enable signal (enable SML) is on, and restore the SML to a precharge state, if necessary, after SML evaluation. The circuit is able to discharge the ML if the SML shows a mismatch.

30 Claims, 5 Drawing Sheets

SMLSense&Restore Circuit

SEGMENTED MATCH LINE ARRANGEMENT FOR CONTENT ADDRESSABLE MEMORY

FIELD OF THE INVENTION

This invention relates to an information processing system and its method of operation. More particularly, it relates to an associative memory device of the type having a dynamic content addressable memory (CAM).

BACKGROUND OF THE INVENTION

Various processing systems perform address translations wherein a first address is translated into a second address. Related references disclose methods and hardware to accomplish these translations. Many of these references utilize content addressable memory (CAM) cells incorporated into integrated semiconductor chips. A CAM is usually described as a device in which a binary data input pattern is compared with stored data patterns to find a matching binary pattern. When the CAM detects such a match, it provides an address or location (called a match address). One scheme is to scan a random address memory (RAM) cell to find the matching data pattern.

U.S. Pat. No. 5,642,114 describes certain match inhibiting features. However, these features work on an individual bit basis rather than on a segmented match line basis. Furthermore, the reference does not use multiple or segmented match lines in each physical row.

U.S. Pat. Nos. 5,471,189; 5,517,441 and 5,659,697 describe multiple match lines for each physical row. They also appear to disclose the combining of the output of one segmented match with the next match line. The ability to disable segmented match lines through the use of signals EN0A, EN1A and NMOS transistors (514a, 514b, 516a and 516b) is shown. However, the ability to properly restore segmented match lines without the use of excessive power consumption or prolongation of the clock cycle time is not disclosed. Furthermore, both static and dynamic XOR circuits are utilized in these references.

U.S. Pat. No. 5,859,791 describes multiple match lines per physical row. However, each of the outputs from the match lines requires an additional wiring resource. Furthermore, independent control for each segmented match line is not available.

Stored information is compared with input information, causing a logic state of a first match line to be modified in response to the comparison. Generally, it is desirable to match the CAM cell height to the height of the corresponding random access memory (RAM) cell to conserve area on the surface of the silicon chip. It is also desirable to utilize the same horizontal wiring track in both the RAM and CAM arrays so there is no wasted area nor wasted wiring resources. However, this requirement makes it difficult to lay out the CAM cell since the RAM cell requires only one horizontal wiring track for a word line (WL) signal, while the CAM cell requires two horizontal wiring tracks: one for the WL signal and one for match line (ML) signal. With these two approaches shown in FIGS. 1A and 1B, it is evident that three horizontal wiring tracks are required for the CAM array: one for the WL, one for the ML, and the third horizontal wire to enable/disable the comparison. Since there is an additional wiring track per row of memory cells, these two approaches are costly in terms of area/wiring resources. The performance of these two approaches is gated by the worst case scenario: only one of the A[1:M] input signals mismatches the content within the CAM cell, so only one stack of two NMOS transistors has to pull the ML low. Therefore, there is some performance penalty for implementing this particular type of CAM using these approaches, compared to a conventional CAM where the worst case scenario is one single NMOS transistor pulling the ML low.

BRIEF DESCRIPTION OF THE INVENTION

The present invention overcomes the difficulties of the prior art to give enhanced segmented match line control for content addressable memory. Among the advantages of the present invention are one or more of the following:

a) It provides for individualized control of each segmented match line.

b) It provides for the output of segmented match lines to be combined with the main match line through a segmented match line (SML) sense and restore circuit, thus not requiring a dedicated signal wire.

c) It includes a match inhibiting feature that works on an individual segmented match line basis.

d) It provides for the proper restore of segmented match lines.

e) It operates with all XOR circuits in a dynamic state.

f) It enhances performance while allowing for a reduction in power utilization.

g) It serves to reduce space requirements.

h) It has fewer NMOS transistors connected to each match line, thus resulting in reduced drain diffusion capacitance and less wiring capacitance, resulting in shorter evaluation time.

These and other benefits and advantages, which will become apparent, are achieved in the manner to be herein described in detail.

The invention relates to a system and a method using a content addressable memory (CAM) having a first set of input data and stored data and a second set of input data and stored data. The CAM can either perform simultaneous searches between both sets of input data against both sets of stored data, or perform searches between the second set of input data and the second set of stored data.

The CAM and the corresponding RAM typically are embedded in a semiconductor chip. The CAM preferably has a cell height that matches the cell height of the RAM for space conservation on the chip. A mismatch between the input data and the corresponding stored data causes the respective NMOS (n-type metal oxide semiconductor) transistor to pull the match line low. In one embodiment, the CAM array uses two horizontal wiring tracks. In another embodiment, the CAM array uses three horizontal wiring tracks.

The invention furthermore includes content addressable memory circuit (CAM) and the method of use. The circuit is used for separating a long match line signal into a segmented match line (SML) and a shorter match line (ML). The circuit includes two sets of CAM cells comprising set A and set B. Set A is used to evaluate the comparison of input A with the stored content of CAM set A, while set B is used for evaluating the comparison of input B with the stored contents of CAM set B. Circuitry is used to sense the value of the segmented match line (SML) and send the result to match line (ML). The circuitry restores the SML to a precharge state after the SML evaluation.

The invention further comprises a segment sense and restore circuit for a segmented match line (SML) having a charge of '1' or '0', as well as the use of the circuit. The circuit comprises means to enable an SML. This means includes a first inverter, a lead from the first inverter to the gate of a first PMOS and a second inverter in series with the first inverter. A line from the second inverter goes to the gate of a first NMOS which is in parallel with the first PMOS to form a transmission gate. A '1' signal from the enable SML will cause the gate to be open and a '0' from the enable will cause the gate to be closed. The circuit includes a charge restore means. This comprises a restore signal line gated through a second PMOS to the SML on the inlet side of the transmission gate to charge the SML. This ML is discharged when the SML signals a mismatch. This is achieved by passing the '0' on the SML through the transmission gate to the third inverter which gates a second NMOS having one lead connected to the ML. The restore signal is gated to a third NMOS which is connected to the other lead of the second NMOS for discharging the ML to ground.

DETAILED DESCRIPTION OF THE INVENTION

This invention generally relates to semiconductor content addressable memory (CAM). The CAM is typically paired with a RAM that stores information that is searchable by the CAM. However, the details of RAMs are well known in the industry and form no part of the present invention, except to the extent that a RAM cell interfaces with a CAM cell and the related sense and restore circuitry. When the address of stored data is known, then a decoder is used to access the data. However, when the address or location of the data in the RAM or other storage facility is not known, the CAM is used to search and compare the content of the input data with that of the stored data, and the content of the corresponding entry in the RAM is read out.

This invention describes a CAM that takes two sets of input data: A and B. This CAM can then simultaneously perform searches between input data A against the stored contents A and between input data B and the stored contents B. It can separately perform searches between input data B stored contents B. If a match is found between input A and stored contents A, or between input B and stored contents B, or both, the matching entry is read out of the RAM.

The advantages of this CAM cell and related circuitry are that it provides an additional function that allows more control for a search, performance enhancement, power reduction, and minimal area requirement.

Turning now to FIG. 1, it shows in 1A and 1B, two approaches to implementing the match inhibit function, both approaches being previously known. The same numbers are used in each drawing to represent similar components.

Figure 1A:
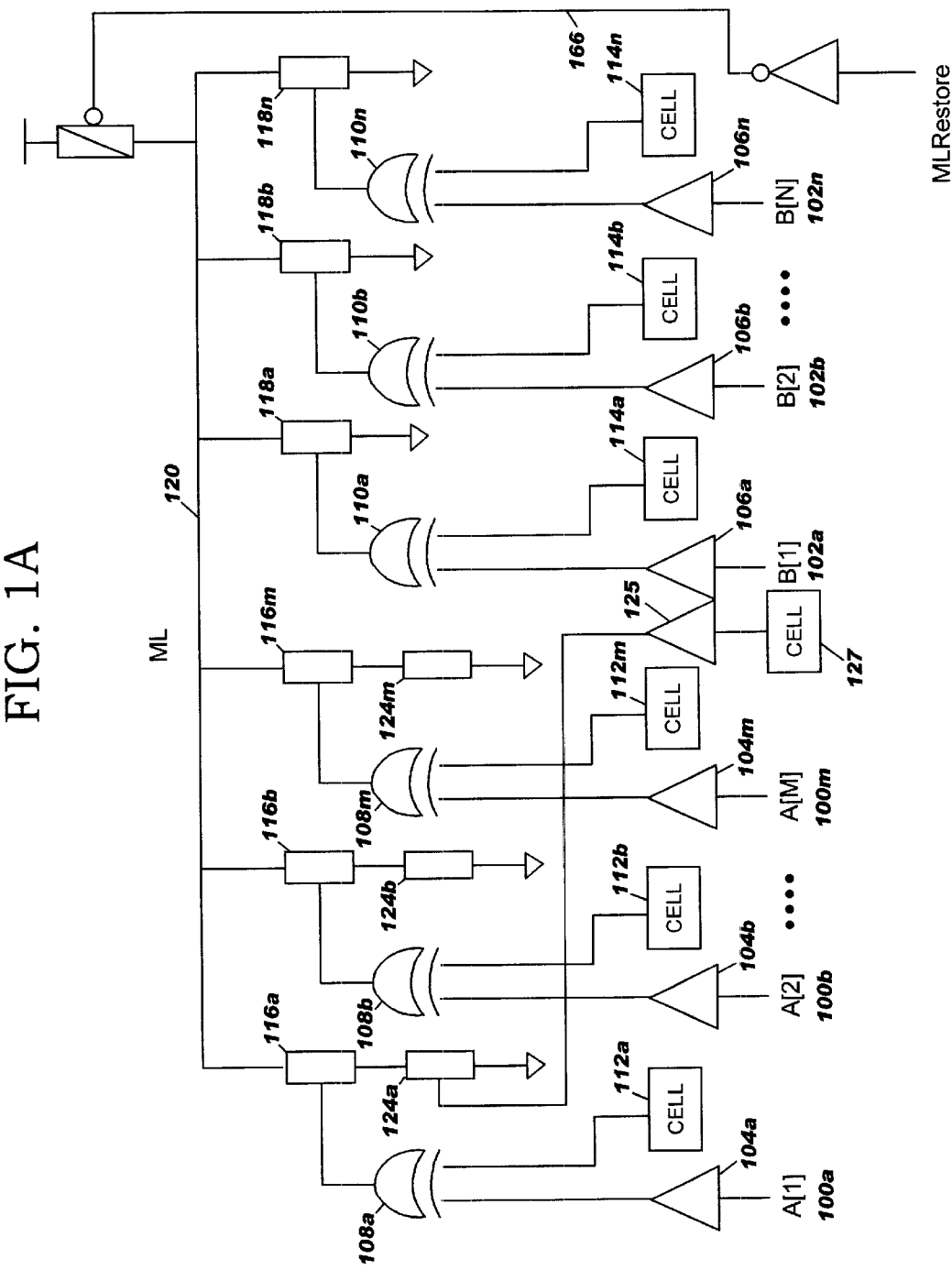
FIG. 1A is a schematic, electrical circuit diagram showing a row of CAM, and one approach to implement a match-inhibiting function.

FIG. 1A shows a plurality of inputs A-1, A-2, etc. through A-m, (100a–100m) and a plurality of inputs B-1, B-2, etc. through B-n (102a–102n). Each of the inputs A goes to a buffer (104a, 104b, 104m), and each of the inputs B goes to a corresponding buffer (106a, 106b, 106n). Inputs A are then driven to dynamic XOR gates (108a–108m) and inputs B are driven to corresponding dynamic XOR gates (110a–110n). Each of the A inputs is compared with the content of a CAM memory cell (112a–112m) and each of the B inputs is compared with the content of CAM memory cell (114a–114n).

Each CAM cell contains one binary bit of memory. Each XOR compares the binary input from one buffer with the binary input from one CAM cell. If both inputs are '0' or both are '1', then the output of the XOR is '0'. If the inputs are different (i.e. the buffer is '0' and the CAM cell is '1', or the buffer is '1' and the cell is '0'), then the output of the XOR will be '1'.

The output of each XOR (108a–108m) connects to a gate of an NMOS transistor (116a–116m) and the output of each XOR (110a–110n) connects to a gate of a NMOS transistor (118a–118n). The gate of the NMOS transistors acts as a switch. Normally, the gate is '0' and the transistor is off. The transistors are connected to a match line ML 120 and to a second set of NMOS transistors (124a–124m). These are gated through a buffer 125 to a memory cell 127. This memory cell stores the match-inhibiting value. A '1' enables the comparison between input A and CAM set A; '0' disables the comparison. The match line 120 is precharged to a '1'. When the signal from the XOR to the gate is a '1' representing a mismatch between the input and the stored value, the gate to the NMOS is open and the match line 120 is discharged to '0'.

Figure 1B:
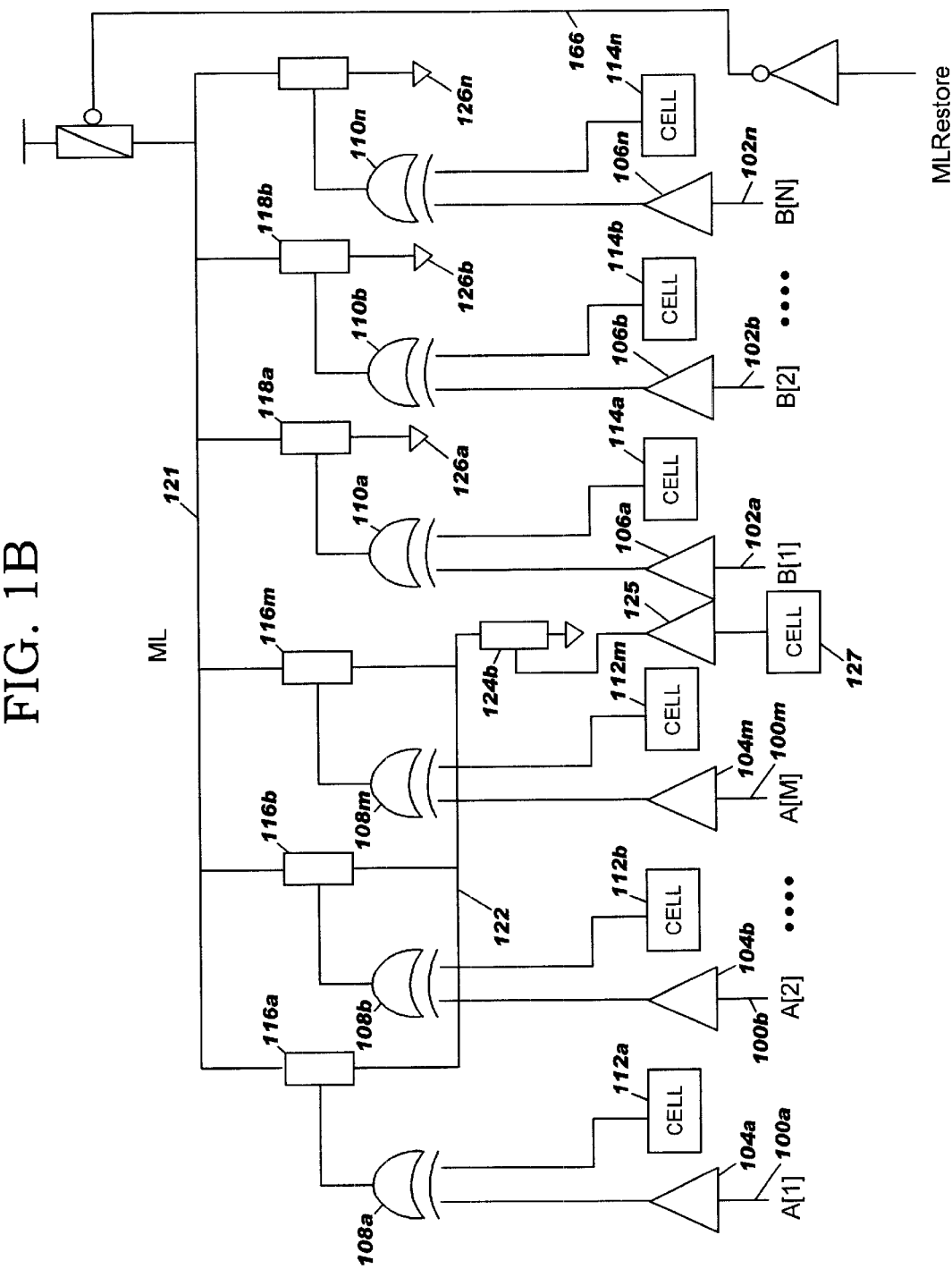
FIG. 1B is a second schematic, electrical circuit diagram showing a row of CAM, and another approach for implementing a match-inhibiting function.

FIG. 1B likewise shows a plurality of inputs A-1, A-2, etc. through A-m, (100a–100m) and a plurality of inputs B-1, B-2, etc. through B-n (102a–102n). Each of the inputs A goes to a buffer (104a, 104b, 104m) and each of the inputs B goes to a corresponding buffer (106a, 106b, 106n). Inputs A are then driven to dynamic XOR gates (108a–108m) and inputs B are driven to corresponding XOR gates (110a–n). Each of the A inputs is compared with the content of one of the CAM memory cells (112a–m) and each of the B inputs is compared with the content of one of the CAM memory cells (114a–114n).

In this embodiment, the output of each XOR (108a–108m) connects to a gate of an NMOS transistor (116a–116m) and the output of each XOR (110a–110n) connects to a gate of a NMOS transistor (118a–118n). The transistors (116a–116m) are connected to a match line ML 121 and to a common line 122. The transistors (118a–118n) are also connected to the match line ML 121 and each transistor is connected to the ground (126a–126n). The match line 121 is precharged to a '1'. When the signal from the XOR to the gate is a '1', the gate NMOS is open and the signal flows through to ground, thereby discharging the line.

This invention utilizes a segmented ML scheme, where it separates one long ML into two parts: a SML (Segmented ML) and a main ML. The SML is for evaluation of the comparison between input A[1:M] and the content stored in the CAM cells A[1:M], and the main ML is for evaluation of the comparison between input B[1:N] and the content stored in the CAM cells B[1:N].

Figure 2:
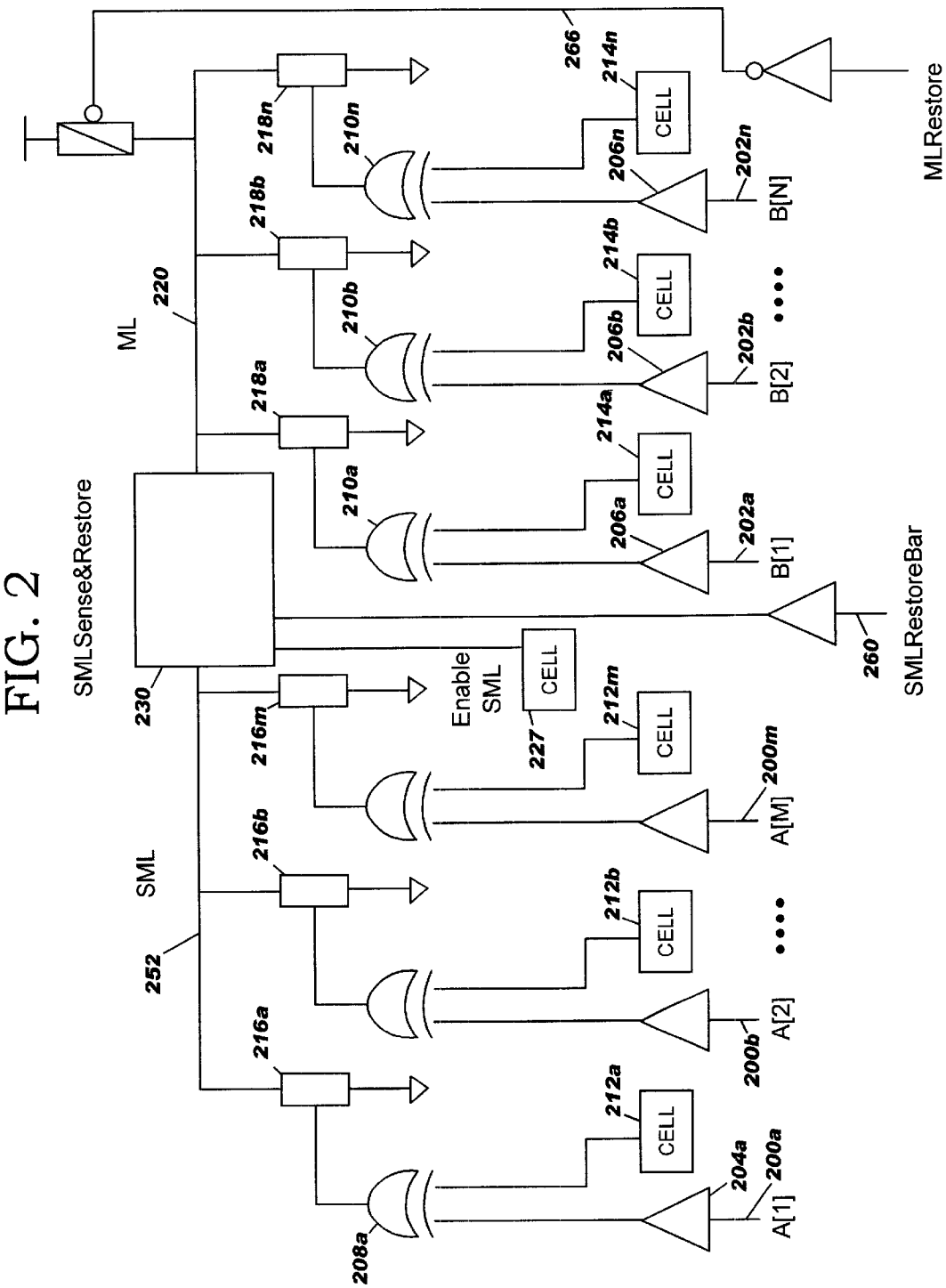
FIG. 2 is a schematic electrical circuit diagram including a segmented match line sense and restore function.

FIG. 2 shows the circuitry for the basic matching features of the present invention with an SML sense and restore circuit 230. A plurality of inputs A-1, A-2, etc. through A-m, (200a–200m) and a plurality of inputs B-1, B-2, etc. through B-n (202a–202n) are shown. Each of the inputs A goes to a buffer (204a, 204b, 204m), and each of the inputs B goes to a corresponding buffer (206a, 206b, 206n). Inputs A are then driven to dynamic XOR gates (208a–208m) and inputs B are driven to corresponding XOR gates (210a–210n). Each of the A inputs is compared with the content of a CAM memory cell (212a–212m) and each of the B inputs is compared with the content of a CAM memory cell (214a–214n). The output signal from each of the XOR gates (208a–208m) is connected to the gate of the transistors (216a–216m) in the manner described in connection with FIGS. 1A and 1B. The resultant signal SML is then sent to the SML sense and restore circuit 230. Memory cell 227 serves the same function as the memory cell 127 in FIG. 1.

Figure 3:
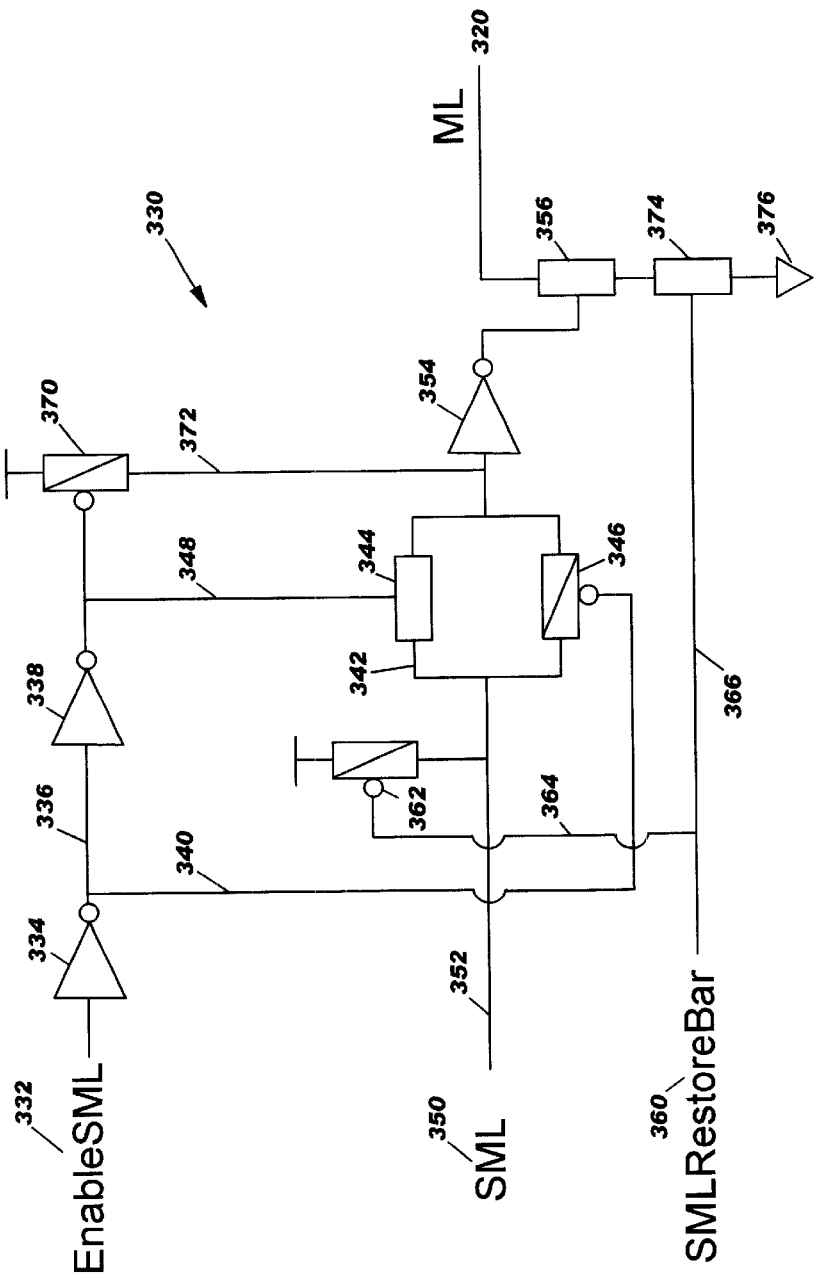
FIG. 3 is a detailed schematic diagram of the SML sense and restore function.

The specialized circuit that ties the SML and the main ML together, the SML sense & restore, is shown in FIG. 3. Generally speaking, this circuitry is utilized to sense the value on the SML, send the result to the main ML if the enable signal (enable SML) is on and restore the SML to a precharge state after SML evaluation. If, however, the enable SML is off, then the state of the SML is ignored by the main ML. This circuit will sense the value of SML and will send the result to the main ML. If the Enable SML is off, then the value of ML will not be affected by the value of SML. The SML restore bar signal controls the restore operation of the SML. It also works with the enable SML to pass the value of the SML to the ML.

The enable SML 332 is connected to a first inverter 334 that reverses the enable SML signal from a '1' to a '0' or from a '0' to a '1'. The signal is sent along line 336 to a second inverter that restores the signal to its original state. The signal also goes along line 340 to the gate of a PMOS transistor 346 that comprises part of a transmission gate 342. The transmission gate also includes an NMOS transistor 344 in parallel with the PMOS transistor 346. These two transistors operate in parallel as a switch for the transmission of the SML signal. When the enable SML signal is a '1', the signal to the PMOS 346 is a '0' which turns on the gate. Concurrently, the signal through the second inverter 338 has been changed back to a '1' which will open the gate of NMOS 344. When the transmission gate 342 is open, the logic state of the SML 350 will be passed along line 352 through the transmission gate and through a third inverter 354 to the gate of a second NMOS transistor 356.

The SML is initially charged high and will become discharged only if there is a mismatch in the comparison of input A with the stored value A in FIG. 2. When the transmission gate 342 is open, the SML logic state, whether it is charged '1' or discharged '0', will control the second NMOS 356. If it is charged because of a match between an input and the stored value, the gate of NMOS 356 is closed. If it is discharged because of a mismatch, the gate becomes open.

The SML restore bar 360 serves to recharge the SML 350 after an evaluation of a mismatch has caused the SML logic signal to be discharged to '0'. During an SML comparison of an input with a stored value, the SML restore bar is disabled to avoid any signal contention. After the comparison has been made, a signal is transmitted from the SML restore bar 360 along line 364 to the gate of a second PMOS transistor 362. If the signal is '0', the gate is open and the SML is recharged to a '1'.

If the enable SML 332 is '0', the transmission gate 342 is closed. The '0' signal, however, turns on the gate of a third PMOS transistor 370 that delivers a '1' along line 372 to inverter 354 which converts the signal to a '0'. This signal closes the gate of the second NMOS 356, thereby preventing the discharge of the charged ML. The SML restore bar signal is also sent along line 366 to the gate of a third NMOS transistor 374. If the signal from the third inverter 354 and from the SML restore bar 360 both are positive, the ML will be discharged through the two transistors 356 and 374 to ground 376.

As can be seen, the output of the SML is combined with the main ML through the SML sense & restore circuit. Thus, because of this recombining, there is no requirement for an extra signal wire. The SML sense & restore circuit allows individual control of each segmented match line of each entry of the CAM. The proper restore of the SML is achieved through this circuit. All of the XOR circuits in the present invention are dynamic. Therefore, there is no need for the first virtual address (SML) to be processed before processing the second virtual address (main ML).

This circuitry provides the following performance benefits. The critical path is one single mismatch within A[1:N], in which just one NMOS transistor pulls the SML low. Then the SML sense & restore circuit senses the value (low in this case) on SML and pulls the ML low.

Even though there is some delay associated with the SML sense & restore circuit, there are a few reasons why it outperforms prior implementations:

With this design, each segment (SML or ML) of the overall match line has fewer number of NMOS transistors connected to it. Less drain diffusion capacitance and less wiring capacitance translate to less evaluation time.

The SML sense & restore circuit utilizes a much larger NMOS transistor to pull the ML low if there is a miss on the SML. This NMOS can discharge the ML much faster than the other smaller NMOS transistors can, so it compensates for the delay associated with SML sense & restore. Since there is just one large NMOS, the added drain capacitance associated with it is not an issue.

This implementation allows an optimal balance for the pull down NMOS transistors. There are a few issues to consider in determining the optimal size (channel width) of those NMOS transistors:

1. The larger the size, the higher the drain capacitance.
2. Since the input data is driven across multiple entries/rows, larger pull down NMOS sizes (hence, larger gate capacitance) would slow down the transition rate on the compare line (CL), and slow down the XOR circuit (see FIG. 4) which, in turn, slows down the evaluation of the SML or ML. Therefore, large NMOS transistors across the SML/ML can only increase performance up to certain point. Moreover, large NMOS across the SML/ML will make the length of the SML/ML/WL longer (increase evaluation time), and will make the area bigger as well. FIG. 4 shows the logical and actual representation of how the compare data input (CL), CAM cell, XOR, ML, and WL are connected.

With this implementation, it is possible to turn off the compare line driver associated with the input A[1:M] to reduce power consumption. Also, the SML associated with all the entries/rows will not be discharged, further reducing power consumption.

AREA AND WIRING RESOURCE BENEFIT

The SML and ML can share the same horizontal wiring track, reducing area and wiring resource needed. Moreover, the size of the NMOS pull down transistors is smaller with this design, which also reduces the amount of area being utilized.

Figure 4B:
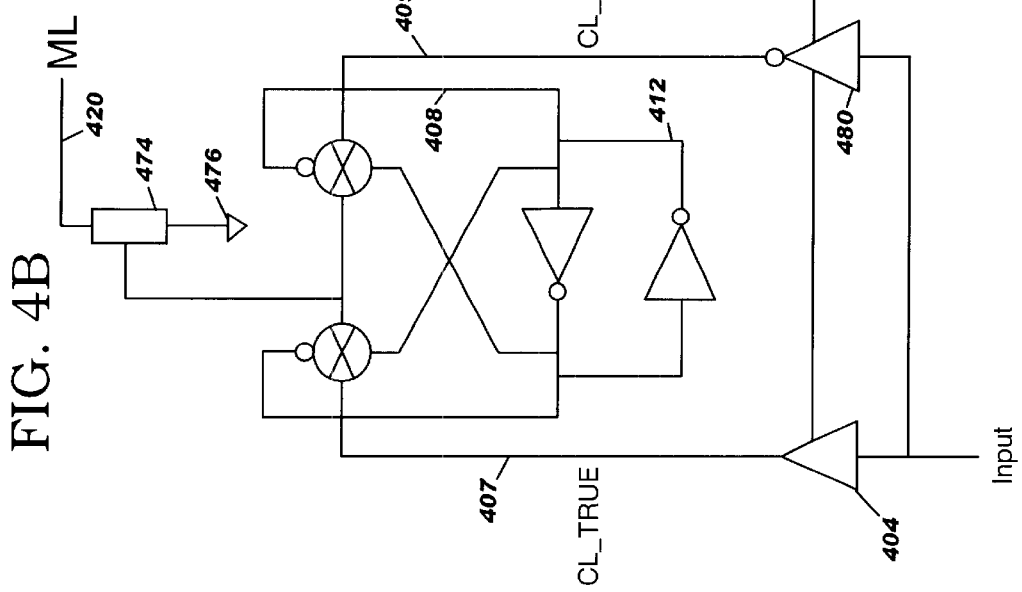
FIGS. 4A and 4B are diagrams showing the connection of the compare data input (CL), the CAM cell, the XOR, the match line (ML) and the driver enable.
Figure 4A:
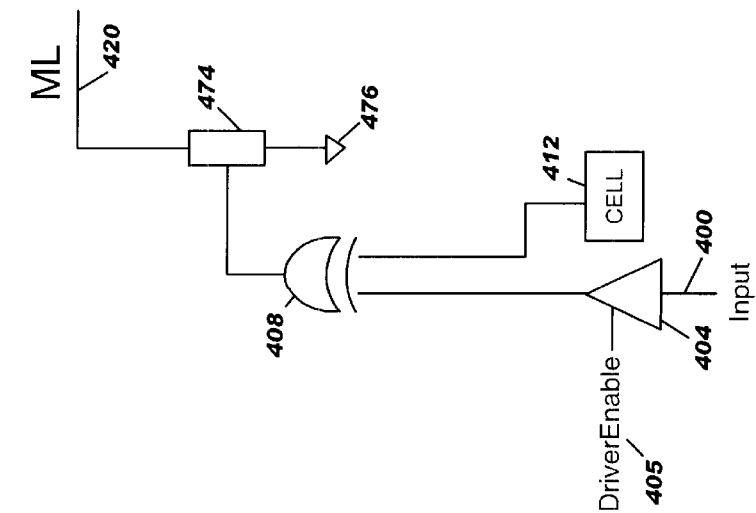

Turning now to FIG. 4A, a view of the enable logic is shown. The input data 400 goes to buffer 404 as previously described. The buffer 404 also takes a signal from a driver enable 405. This driver enable is turned on or off using a clock core logic that handles the sequencing of various functions according to protocols that are well known in the art and, therefore, do not comprise a part of the present invention. When it is desired to do a precharge of the match line 420 to '1', the driver enable 405 is turned off. The signal from the XOR 408 gates the NMOS transistor 474 and serves to discharge the ML 420 to ground 476 when the XOR signals a mismatch between the input and the stored data. If there is no mismatch, the ML does not discharge through the transistor.

FIG. 4B shows more details of the circuitry of FIG. 4A, with the driver enable 405 controlling both the buffer 404 and an inverter 480. When the driver enable 405 is '1', the CL_True has the same value as the input 400 to the buffer 404, and the CL_Comp produces a complement of the input. Thus, if the input (and thus the CL_True) is '0', the CL_Comp will be a '1', and if the input is '1', then the CL_Comp is '0'. If, however, the driver enable is turned off and the value is a '0', both the CL_Comp and the CL_True are '0'. Also shown is the conventional circuitry for the CAM cell 412 and the XOR 408

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A system comprising a content addressable memory (CAM) including circuitry to separate a match line of data into a segmented match line (SML) and a main match line (ML), means to either simultaneously compare the SML stored data and the ML stored data against a first set of input data and a second set of input data and to combine the output of the SML with the output of the ML, or to compare only the ML stored data with the second set of input data, and means to sense the value of the SML and to restore the SML to a recharge state after the comparison.

2. The system according to claim 1 wherein the stored data is stored in an array of CAM cells.

3. The system according to claim 1 wherein the SML signal is connected to a first set of NMOS transistors and the ML signal is connected to another set of NMOS transistors.

4. The system according to claim 3 wherein a mismatch between the SML input data and the corresponding stored data causes the respective NMOS transistor to pull the match line low.

5. The system according to claim 4 wherein the same horizontal wiring track is used for the SML and the ML within the circuit.

6. The system according to claim 4 wherein the CAM array uses two horizontal wiring tracks.

7. A method of comparing input data with stored data using a content addressable memory (CAM) including the steps of
   a) providing a circuitry to separate a match line of data into a segmented match line (SML) and a main match line (ML),
   b) either simultaneously comparing the SML stored data and the ML stored data against a first set of input data and a second set of stored data and combining the output of the SML with the output of the ML, or comparing only the ML stored data with the second set of input data;
   c) sensing the value of the SML, and
   d) restoring the SML after the comparison if the SML is discharged.

8. The method according to claim 7 comprising storing the stored data in an array of CAM cells.

9. The method according to claim 8 wherein the respective NMOS transistor pulls the match line low if there is a mismatch between the SML input data and the corresponding stored data.

10. The method according to claim 9 including the use of two horizontal wiring tracks within the CAM array.

11. The method according to claim 7 including the steps of passing the SML input data to gate a set of NMOS transistors and passing the ML input data to gate a second set of NMOS transistors.

12. The method according to claim 11 wherein the SML and ML share the same horizontal wiring track within the CAM array.

13. A content addressable memory circuit (CAM) comprising:
   a) a long match line signal divided into a segmented match line (SML) and a shorter match line (ML);
   two sets of CAM cells comprising set A and set B;
   c) means for comparing a plurality of inputs A with the stored content of an array A of sources;
   d) means for comparing a plurality of inputs B with the stored contents of an array B of sources;
   e) means for evaluating the comparisons between inputs A and the contents of the A sources;
   f) means to sense the value of the segmented match line (SML); and
   g) means to combine the SML and the ML.

14. The circuit according to claim 13 further including an XOR gate to compare each input with a source, and wherein each source comprises a CAM cell.

15. The circuit according to claim 14 wherein the means to sense the value of the SML comprises circuitry to enable the SML and circuitry to restore the SML charge if the SML becomes discharged.

16. The circuit according to claim 15 wherein the SML enable circuit comprises:
   a first inverter;
   a lead from the first inverter to the gate of a first PMOS;
   a second inverter in series with the first inverter;
   a line from the second inverter to the gate of a first NMOS; the first NMOS and the first PMOS being in parallel with one another to form a transmission gate whereupon a '1' signal from the enable SML will cause the transmission gate to be open, and a '0' from the enable will cause the gate to be closed.

17. The circuit according to claim 16 wherein the charge restore circuit comprises a restore signal line gated through a PMOS to the SML on the inlet side of the transmission gate to restore the SML charge if said charge is '0'.

18. The circuit according to claim 17 wherein the restore signal line is gated to a third NMOS in series with the second NMOS for discharge of the ML when both the second and the third NMOSs are open.

19. A method of utilizing a content addressable memory circuit (CAM) comprising: providing a segmented match line (SML) and a main match line (ML) from a longer match line.
   a) providing two sets of CAM cell arrays comprising set A and set B;
   b) providing means for evaluating the comparison of input A with the stored content of CAM set A;

c) evaluating the comparisons between inputs A and the contents of the A sources;

d) sensing the value of the segmented match line (SML); and e) combining the SML and the ML.

20. The method according to claim 19 further including providing an XOR gate to compare each input with a source, and providing a CAM cell for each source.

21. The method according to claim 20 including sensing the value of the SML using circuitry to enable the SML and additional circuitry to restore a charge to the SML if the SML becomes discharged.

22. The method according to claim 21 wherein the SML enable circuit comprises:

passing an enable value through a first inverter;

sending the inverted value from the first inverter to the gate of a first PMOS;

also sending the inverted value to a second inverter in series with the first inverter;

sending the restored value from the second inverter to the gate of a first NMOS; the first NMOS and the first PMOS being in parallel with one another to form a transmission gate whereupon a '1' signal from the enable SML will cause the transmission gate to be open and a '0' from the enable will cause the gate to be closed.

23. The method according to claim 22 wherein the charge is restored by providing a restore signal line gated through a PMOS to the SML on the inlet side of the transmission gate to restore the SML charge when the SML charge is '0'.

24. The method according to claim 23 including the steps of gating the restore signal line to a third NMOS in series with the second NMOS, and for discharging the ML when both the second and the third NMOSs are open.

25. A sense and restore circuit for a segment match line (SML) having a charge of '1' or '0', comprising:

a) an SML enable circuit having:
a first inverter;
a lead from the first inverter to the gate of a first PMOS;
a second inverter in series with the first inverter;
a line from the second inverter to the gate of a first NMOS; the first NMOS and the first PMOS connected in parallel to form a transmission gate whereupon a '1' signal from the enable SML will cause the gate to the SML to be open for the logic state of the SML to pass through the gate, and a '0' from the enable will cause the gate to be closed;

b) a restore circuit having:
a restore signal line gated through a second PMOS to the SML on the inlet side of the transmission gate to charge the SML when the SML charge is '0';

c) discharge means for the ML when the SML signals a mismatch having: a value of '1' on the enable SML signal so that a '0' on SML can be passed through the transmission gate to the third inverter and the output of the third inverter gating a second NMOS having one lead connected to the ML; and
the restore signal gated to a third NMOS connecting the ML and the second NMOS to ground.

26. The circuit according to claim 25 further including a driver enable that activates and disables the compare line buffer/inverter in response to an external clock core logic.

27. The circuit according to claim 25 wherein the SML is recharged by the restore circuit.

28. A method of utilizing a sense and restore circuit for a segment match line (SML) having a charge of '1' showing a match or a '0' showing a mismatch, comprising:

a) enabling an SML
inverting an enable signal and passing one line of the inverted signal to the gate of a first PMOS;
inverting a second line of the inverted signal and passing the twice inverted enable signal to the gate of a first NMOS; the first NMOS and the first PMOS connected in parallel to form a transmission gate, whereupon a '1' signal from the enable SML will cause the transmission gate to be open for the logic state of the SML to pass through, and a '0' signal from the enable SML will cause the gate to be closed;

b) restoring a charge to the SML when the SML is discharged due to a mismatch, by gating a restore signal line through a PMOS to the SML on the inlet side of the transmission gate to charge the SML when the charge is '0';

c) discharging the ML when the SML signals a mismatch by having a value of '1' on the enable SML signal so that a '0' on SML can be passed through the transmission gate to the third inverter, and
using the output of the third inverter to gate a second NMOS having one lead connected to the ML; and
using the restore signal to gate a third NMOS connected in series with the second NMOS, whereupon opening of the second and the third NMOSs will discharge the ML to ground.

29. The method according to claim 28 wherein a driver enable provides a '0' or a '1' signal to enable the compare line buffer/inverter in response to external clock core logic.

30. The method according to claim 28 including recharging of the SML by the restore circuit.

* * * * *